United States Patent
Bourstein (10) Patent No.: US 12,255,178 B2
(45) Date of Patent: Mar. 18, 2025

(54) MIRROR IMAGE OF GEOMETRICAL PATTERNS IN STACKED INTEGRATED CIRCUIT DIES

(71) Applicant: Mellanox Technologies, Ltd., Yokneam (IL)

(72) Inventor: Ido Bourstein, Pardes Hana—Karkur (IL)

(73) Assignee: Mellanox Technologies, Ltd, Yokneam (IL)

(*) Notice: Subject to any disclaimer, the term of this patent is extended or adjusted under 35 U.S.C. 154(b) by 566 days.

(21) Appl. No.: 17/584,450

(22) Filed: Jan. 26, 2022

(65) Prior Publication Data

US 2023/0238358 A1   Jul. 27, 2023

(51) Int. Cl.
*H01L 25/065*   (2023.01)
*G03F 1/20*   (2012.01)
*H01L 23/00*   (2006.01)

(52) U.S. Cl.
CPC ............ *H01L 25/0657* (2013.01); *G03F 1/20* (2013.01); *H01L 24/06* (2013.01); *H01L 24/08* (2013.01); *H01L 24/80* (2013.01); *H01L 2224/06177* (2013.01); *H01L 2224/08145* (2013.01); *H01L 2224/80895* (2013.01)

(58) Field of Classification Search
CPC ..... H01L 25/0657; H01L 24/06; H01L 24/08; H01L 24/80; H01L 2224/08145; H01L 2224/06177; G03F 1/20; G03F 1/00
See application file for complete search history.

(56) References Cited

U.S. PATENT DOCUMENTS

| | | | |
|---|---|---|---|
| 7,315,454 B2 | 1/2008 | Schuster | |
| 2006/0145023 A1* | 7/2006 | Babb | B64G 1/646 244/172.4 |
| 2010/0289131 A1 | 11/2010 | Bathan et al. | |
| 2011/0248396 A1 | 10/2011 | Liu et al. | |
| 2013/0228916 A1* | 9/2013 | Mawatari | H01L 24/14 257/737 |
| 2016/0037643 A1 | 2/2016 | Kim et al. | |
| 2016/0118095 A1* | 4/2016 | Pelley | H01L 25/0657 365/230.01 |
| 2016/0172332 A1 | 6/2016 | Haba et al. | |
| 2019/0066738 A1* | 2/2019 | Brox | G11C 5/04 |
| 2019/0221557 A1* | 7/2019 | Kim | H01L 24/80 |

(Continued)

FOREIGN PATENT DOCUMENTS

CN   210489612 U   5/2020

OTHER PUBLICATIONS

Bourstein, U.S. Appl. No. 17/493,882, filed Oct. 5, 2021.

*Primary Examiner* — Mamadou L Diallo
(74) *Attorney, Agent, or Firm* — Meitar Patents Ltd.; Daniel Kligler (57) ABSTRACT

An electronic device includes a first integrated circuit (IC) die and a second IC die. The first IC die includes a first set of contact pads arranged in a first geometrical pattern on a first surface of the first IC die, the second IC die includes a second set of the contact pads that are arranged, on a second surface of the second IC die, in a second geometrical pattern that is a mirror image of the first geometrical pattern. The second surface of the second IC die is facing the first surface of the first IC die, and the contact pads of the first and second sets are aligned with one another and mounted on one another.

11 Claims, 4 Drawing Sheets

(56) References Cited

U.S. PATENT DOCUMENTS

| | | | |
|---|---|---|---|
| 2021/0028135 A1* | 1/2021 | Said | H01L 24/80 |
| 2021/0151408 A1 | 5/2021 | Yu et al. | |
| 2021/0320075 A1* | 10/2021 | Hou | H01L 24/05 |
| 2021/0366855 A1* | 11/2021 | Okina | H01L 24/08 |
| 2021/0375790 A1* | 12/2021 | Oda | H01L 24/80 |
| 2022/0059455 A1* | 2/2022 | Chen | H01L 21/76802 |
| 2022/0077116 A1* | 3/2022 | Park | H01L 25/50 |
| 2022/0093555 A1* | 3/2022 | Hou | H01L 24/05 |
| 2022/0139441 A1* | 5/2022 | Ogawa | G11C 11/4094 |
| | | | 365/185.23 |
| 2022/0149002 A1* | 5/2022 | Hou | H01L 25/18 |
| 2022/0336394 A1* | 10/2022 | Ishikawa | H01L 24/06 |

* cited by examiner

MIRROR IMAGE OF GEOMETRICAL PATTERNS IN STACKED INTEGRATED CIRCUIT DIES

FIELD OF THE INVENTION

The present invention relates generally to packaging of electronic devices, and particularly to techniques for improving the stacking of integrated circuit (IC) dies face-to-face.

BACKGROUND OF THE INVENTION

Various techniques of stacking electronic devices face-to-face are known in the art.

SUMMARY OF THE INVENTION

An embodiment of the present invention that is described herein provides an electronic device including a first integrated circuit (IC) die and a second IC die. The first IC die includes a first set of contact pads arranged in a first geometrical pattern on a first surface of the first IC die, the second IC die includes a second set of the contact pads that are arranged, on a second surface of the second IC die, in a second geometrical pattern that is a mirror image of the first geometrical pattern. The second surface of the second IC die is facing the first surface of the first IC die, and the contact pads of the first and second sets are aligned with one another and mounted on one another.

In some embodiments, the first geometrical pattern is non-symmetrical under reflection about a given axis in a plain of the first IC die, and the second geometrical pattern is a mirror image of the first geometrical pattern with respect to the given axis. In other embodiments, the contact pads in each of the first and second sets include one or more first contact pads of a first type and one or more second contact pads of a second type, and when the second surface is facing the first surface, the first contact pads in the first and second sets are mounted on one another, and the second contact pads in the first and second sets are mounted on one another. In yet other embodiments, each of the first and second IC dies includes first and second sections, and when the second surface is facing the first surface, the first section of the first and second sets are mounted on one another and the second section of the first and second sets are mounted on one another.

In an embodiment, the first IC die includes a first set of layers having at least a given layer including a first set of circuit components arranged in a first geometrical model, and the second IC die includes a second set of the layers having at least the given layer, which includes a second set of the circuit components that are arranged on the given layer of the second set, in a second geometrical model that is a mirror image of the first geometrical model. In another embodiment, the first IC die and the second IC die include a same product.

There is additionally provided, in accordance with an embodiment of the present invention, a set of reticles, the set including: (a) at least a first mask for producing a first integrated circuit (IC) die, the first mask including a first set of elements that are arranged in a first geometrical pattern and are configured to attenuate a beam impinging thereon, and (b) at least a second mask for producing a second IC die, the second mask including a second set of the elements that are: (i) arranged in a second geometrical pattern that is a mirror image of the first geometrical pattern, and (ii) configured to attenuate the beam impinging thereon.

In some embodiments, the first and second masks are located in first and second different reticles in the set. In other embodiments, the first and second masks are located in first and second different sections of a same reticle in the set.

There is further provided, in accordance with an embodiment of the present invention, a method for producing an electronic device, the method including producing, on a first surface of a first integrated circuit (IC) die, a first set of contact pads arranged in a first geometrical pattern. A second set of the contact pads that are arranged in a second geometrical pattern, which is a mirror image of the first geometrical pattern, is produced. The second surface of the second IC die is positioned opposite the first surface of the first IC die, such that the contact pads of the first and second sets are aligned with one another, and the contact pads of the first and second sets are coupled with one another.

In some embodiments, producing the first set includes arranging the first geometrical pattern in a non-symmetrical pattern under reflection about a given axis in a plain of the first IC die, and producing the second set includes arranging the second geometrical pattern in the mirror image of the first geometrical pattern with respect to the given axis. In other embodiments, the method includes: (a) producing the first IC die using at least a first mask that includes a first set of elements that are arranged in a first geometrical pattern and are configured to attenuate a beam impinging thereon, and (b) producing the second IC die using at least a second mask that includes a second set of the elements that are: (i) arranged in a second geometrical pattern that is a mirror image of the first geometrical pattern and (ii) configured to attenuate the beam impinging thereon. In yet other embodiments, producing the first and second IC dies includes applying the beam to the first and second masks, respectively, for producing the first and second geometrical patterns on the first and second surfaces.

In an embodiment, the first and second masks are located in first and second different reticles, and applying the beam includes applying a first beam to the first reticle using a first lithography process, and applying a second beam to the second reticle using a second lithography process, other than the first lithography process. In another embodiment, a plurality of the first IC dies are produced on a first substrate, and a plurality of the second IC dies are produced on a second substrate, different from the first substrate, and the method includes, identifying: (i) in the first substrate, a known good site (KGS), which is qualified for producing the electronic device and is intended to be the first IC die, and (ii) in the second substrate, a known good die (KGD), which is qualified for producing the electronic device and is intended to be the second IC die.

In some embodiments, coupling the contact pads of the first and second sets includes separating the KGD from the second substrate for producing the second IC die and coupling between the contact pads of the second set and the contact pads of the first set that are located together with the first IC die on the first substrate. In other embodiments, the first and second masks are located in first and second different sections of a same reticle, and applying the beam includes applying the beam to the same reticle while preforming a same lithography process. In yet other embodiments, a first plurality of the first and second IC dies are produced on a first substrate, and a second plurality of the first and second IC dies are produced on a second substrate, different from the first substrate, and the method includes, identifying: (i) in the first substrate, a known good site (KGS), which is qualified for producing the electronic device and is intended to be the first IC die, and (ii) in the second substrate, a known good die (KGD), which is qualified for producing the electronic device and is intended to be the second IC die.

There is additionally provided, in accordance with an embodiment of the present invention, an electronic device including a package and a stack of first and second chips mounted on the package. The first chip has a first outer pattern, and the second chip has a second outer pattern, which is facing the first outer pattern, and is a mirror image of the first outer pattern.

In some embodiments, the first outer pattern is non-symmetrical under reflection about a given axis in a plain of the first chip, and the second pattern is a mirror image of the first pattern with respect to the given axis.

The present invention will be more fully understood from the following detailed description of the embodiments thereof, taken together with the drawings in which:

DETAILED DESCRIPTION OF EMBODIMENTS

Overview

Some electronic devices comprise a stack of two or more Integrated Circuit (IC) dies, also referred to herein as chips, mounted on a package of the respective electronic device. There are several techniques for stacking IC dies, such as but not limited to, face-to-back (FTB) and face-to-face (FTF) stacking. In the context of the present disclosure the term "face" refers to the side of the IC die having embedded active components, and the term "back" refers to the opposite side of the IC die, which typically does not have active components such as transistors and memory cells.

Process integration of FTB stacking is typically complicated, includes many process steps and may require support wafers in addition to the functional integrated wafers, whereas the process integration of FTF stacking is simpler, typically requires only the two functional wafers, and therefore, may reduce the production costs of the electronic device. In FTF stacking of a first IC die and a second IC die, the first IC die has a first outer surface intended to face a second outer surface of the second die.

The first and second outer surfaces have respective sets of contact pads arranged in a geometrical pattern. In FTF stacking the second surface is mounted on the first surface, and in case the geometrical patterns are symmetrical, the contact pads are aligned with one another. However, in most of the IC dies the geometrical pattern of the contact pads is non-symmetrical under reflection about a given axis in a plain of the respective IC die (s). FTF stacking of IC dies having a non-symmetrical geometrical pattern may result in misalignment between the contact pads.

In principle, it is possible to form on one or both of the first and second surfaces, electrical traces for electrically connecting between the contact pads of the first and second IC dies. Such electrical traces, however, increase the complexity and cost associated with FTF stacking.

Embodiments of the present invention that are described hereinbelow provide techniques for improving the process of FTF stacking of two or more IC dies that are typically of the same product and hence has the same die size.

In some embodiments, an electronic device comprises first and second IC dies stacked on one another using a FTF configuration. The first IC die comprises a first set of contact pads arranged in a first geometrical pattern on a first surface of the first IC die. The second IC die comprises a second set of the contact pads that are arranged, on a second surface of the second IC die, in a second geometrical pattern that is a mirror image of the first geometrical pattern.

In some embodiments, the first geometrical pattern is non-symmetrical under reflection about a given axis in a plain of the first IC die, and the second geometrical pattern is a mirror image of the first geometrical pattern with respect to the given axis.

In some embodiments, when mounting the second IC die on the first IC die in the FTF configuration, the second surface of the second IC die is facing the first surface of the first IC die, and the contact pads of the first and second IC dies are aligned with one another and are coupled with one another.

In some embodiments, the IC dies are produced using very large-scale integration (VLSI) processes, such as photolithography and etching for defining and transferring geometrical patterns in various layers of the IC dies.

In a photolithography process, a beam is directed to a reticle that may be positioned between the beam source and a semiconductor wafer processed for producing the IC dies. The reticle comprises one or more masks, each mask comprising a set of elements that are arranged in a masking geometrical pattern and are configured to attenuate the beam impinging thereon, so as to define the geometrical pattern in the respective layer of the IC die.

In the present example, the masks of each layer comprise: (i) a first mask having a first masking geometrical pattern of the beam-attenuating elements, and (ii) a second mask having a second masking geometrical pattern, which is a mirror image of the first masking geometrical pattern.

In some embodiments, the first and second masks may be disposed on the same reticle, e.g., in case the area of the IC die is smaller than half of the area of the respective reticle. In such embodiments, the first and second dies may be produced using a single photolithography process step, and the first and second dies are sorted during the assembly and packaging process to carry out the FTF stacking.

In the context of the present disclosure and in the claims, the terms lithography and photolithography are used interchangeably.

In other embodiments, the area of the IC die is larger than half of the area of the respective reticles, so that separate reticles, e.g., first and second reticles, are required for patterning the first and second IC dies, respectively. In such embodiments, first and second sets of photolithography process steps are required for patterning one or more layers (typically each layer) of the first and second IC dies, respectively. Embodiments related to the reticles and the production processes are described in more detail in FIGS. 4-9 of the detailed description below.

The disclosed technique is using a standard FTF stacking process, allowing use of a non-symmetrical IC design which greatly reduces the required design complexity and effort to design a symmetrical IC for FTF process.

System Description

Figure 1:
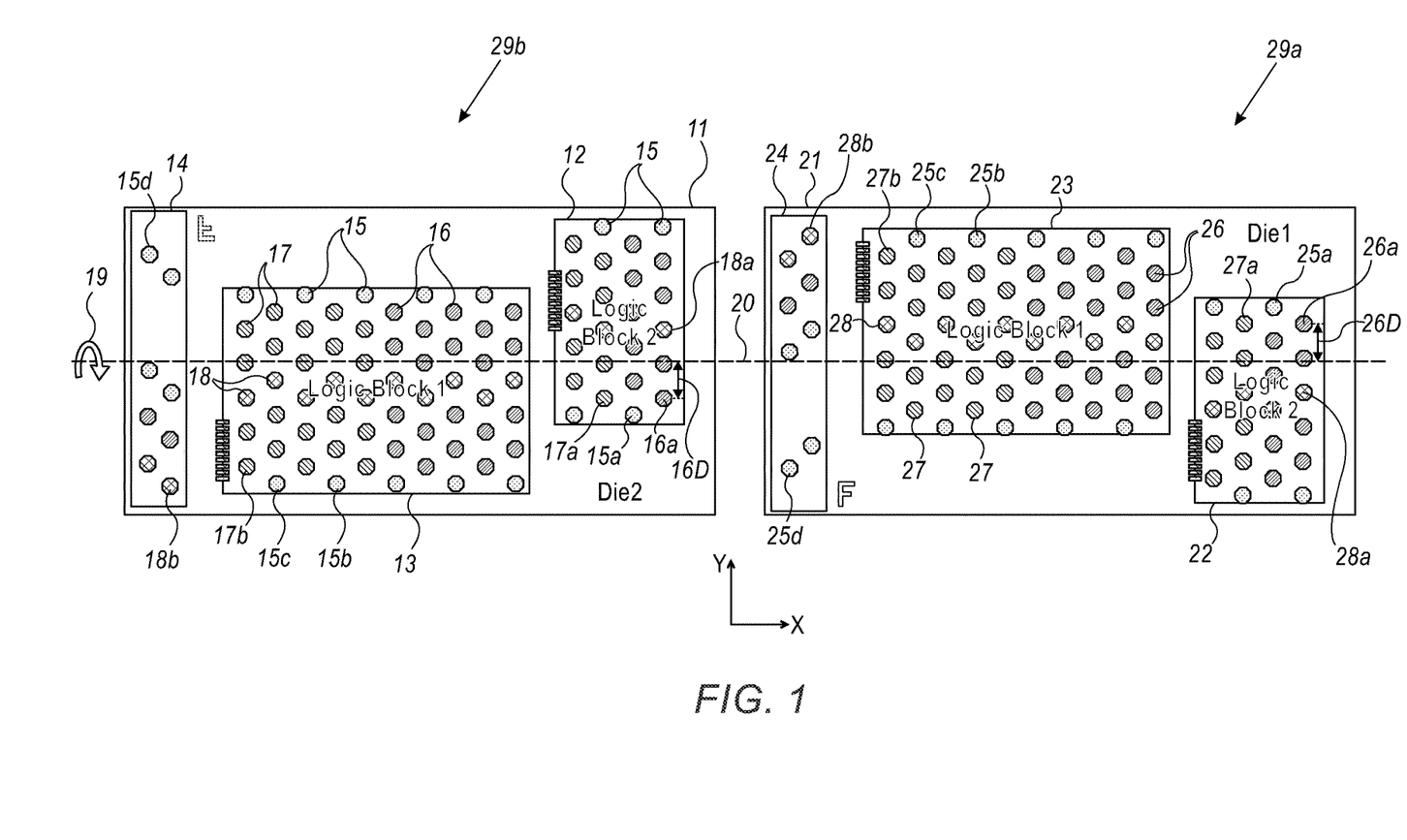
FIG. 1 is a schematic, top view of first and second integrated circuit (IC) dies, in accordance with an embodiment of the present invention.

FIG. 1 is a schematic, top view of integrated circuit (IC) dies 11 and 21, in accordance with an embodiment of the present invention. In the context of the present disclosure and in the claims, the term "die" refers to a chip in various steps of the production process thereof.

In some embodiments, IC dies 21 and 11 comprise first and second respective sets of contact pads arranged in first and second geometrical patterns, respectively. Each of IC dies 21 and 11 comprises multiple sections, also referred to herein as blocks. In the present example, IC die 21 comprises blocks 22, 23 and 24, and IC die 11 comprises blocks 12, 13 and 14. Each of the blocks comprises one or more types of the contact pads. For example, block 13 comprises: (i) contact pads 18 configured to exchange electrical signals with the source of respective transistors (not shown) of IC die 11, (ii) contact pads 15 configured to exchange electrical signals with the drain of respective transistors (not shown) of IC die 11, and (iii) contact pads 16 and 17 configured to exchange electrical signals with transmitting and receiving ports (not shown) of IC die 11, respectively.

Similarly, block 23 comprises: (i) contact pads 28 configured to exchange electrical signals with the source of respective transistors (not shown) of IC die 21, (ii) contact pads 25 configured to exchange electrical signals with the drain of respective transistors (not shown) of IC die 21, and (iii) contact pads 26 and 27 configured to exchange electrical signals with transmitting and receiving ports (not shown) of IC die 21, respectively.

In some embodiments, a first geometrical pattern of the contact pads of IC die 21, also referred to herein as a geometrical pattern 29a, is non-symmetrical under reflection about an axis 20 in a plain of IC die 21. Moreover, a second geometrical pattern of the contact pads of IC die 11, also referred to herein as a geometrical pattern 29b, is a mirror image of geometrical pattern 29a with respect to axis 20.

In such embodiments, when flipping the IC die 11 in a direction 19 about axis 20, contacts pads 15 and 25 are facing one another, contact pads 16 and 26 are facing one another, contact pads 17 and 27 are facing one another, and contact pads 18 and 28 are facing one another. More specifically, in blocks 13 and 23: contact pads 17b and 27b are facing one another, contact pads 15c and 25c are facing one another, and contact pads 15b and 25b are facing one another. In blocks 14 and 24: contact pads 15d and 25d are facing one another, and contact pads 18b and 28b are facing one another. In blocks 12 and 22, contact pads 17a and 27a are facing one another, contact pads 15a and 25a are facing one another, contact pads 18a and 28a are facing one another, and contact pads 16a and 26a are facing one another.

With reference to an XY coordinate system of IC dies 11 and 21, each contact pad of IC dies 11 and 21 has a predefined distance from axis 20 along the Y-axis. In some embodiments, in all the examples described above, the distance of each contact pad of IC die 11 from axis 20 equals to that of the counterpart contact pad of IC die 21. For example, a distance 16D between axis 20 and contact pad 16a of IC die 11 equals to a distance 26D between axis 20 and contact pad 26a of IC die 21.

Note that the equality of distances 16D and 26D is obtained by applying the mirror image to the geometrical pattern of IC die 11 with respect to that of IC die 21. In other words, the geometrical pattern of IC die 11 is formed by flipping the geometrical pattern of IC die 21 in direction 19 about axis 20, and does not require additional effort in designing the geometrical pattern of IC die 11.

This layout configuration of IC dies 11 and 21 is shown by way of example. Embodiments of the present invention, however, are by no means limited to this specific sort of example layout of IC dies 11 and 21, and the principles described herein may similarly be applied to other sorts of IC dies intended to be stacked in a face-to-face as shown in FIGS. 2 and 3 below.

Figure 2:
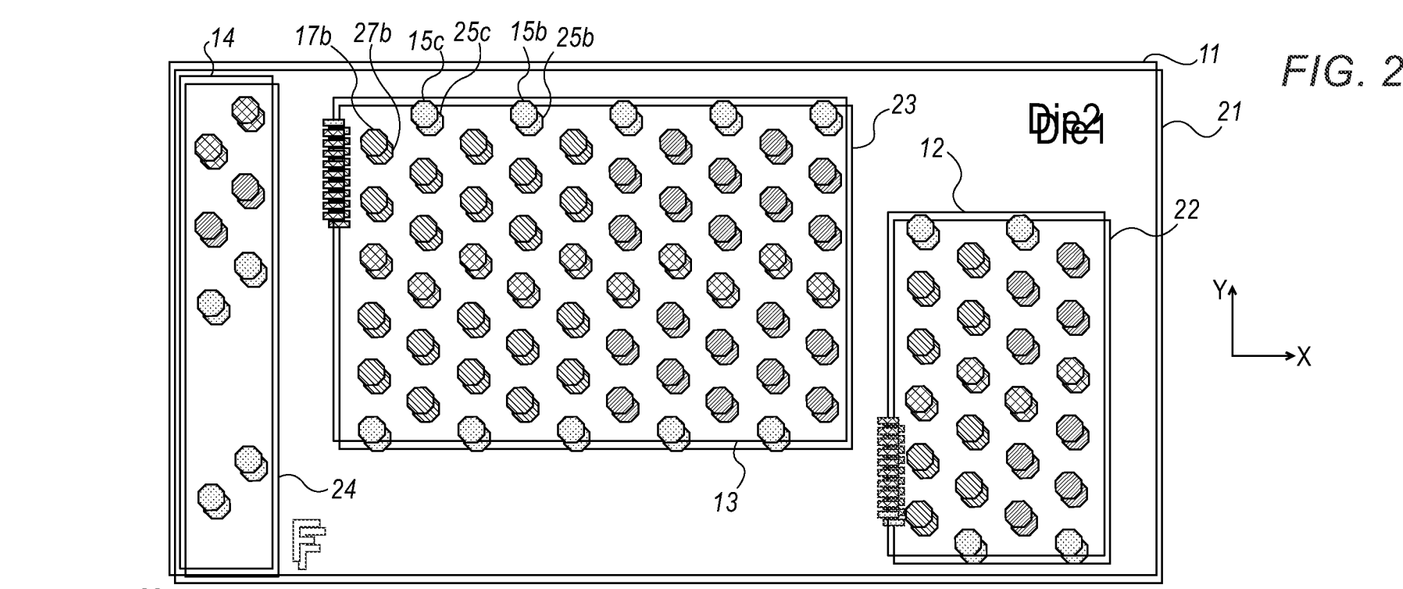
FIG. 2 is a schematic, top view of the first and second IC dies of FIG. 1 stacked on one another in a face-to-face (FTF) configuration, in accordance with an embodiment of the present invention.

FIG. 2 is a schematic, top view of IC dies 11 and 21 stacked on one another in a face-to-face (FTF) configuration, in accordance with an embodiment of the present invention. In some embodiments, the contact pads of IC die 11 are aligned with the respective contact pads of IC die 21. For example, contact pads 17b and 27b are aligned with one another, i.e., have the same X and Y coordinates in the XY coordinate system of the FTF stacked structure of IC dies 11 and 21. Similarly, contact pads 15c and 25c are aligned with one another, and contact pads 15b and 25b are aligned with one another.

In the context of the present disclosure and in the claims, the term "aligned", and grammatical variations thereof refers to substantially aligned dies in XY plane but may include an offset subject to manufacturing tolerances.

Figure 3:
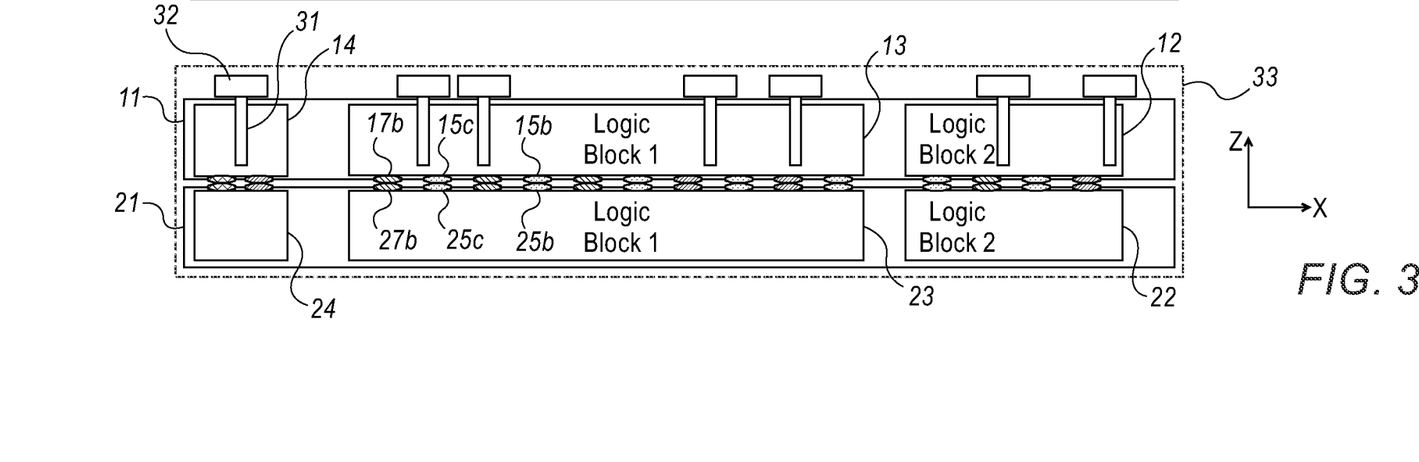
FIG. 3 is a schematic, sectional view of the first and second IC dies stacked on one another in the FTF configuration, in accordance with an embodiment of the present invention.

FIG. 3 is a schematic, sectional view of a package 33 comprising IC dies 11 and 21 stacked on one another in the FTF configuration, in accordance with an embodiment of the present invention.

In some embodiments, contact pads 17b and 27b are aligned with one another in XY plain and are mounted on one another along a Z-axis of an XZ coordinate system of FIG. 3. Similarly, contact pads 15c and 25c are aligned with one another and are mounted on one another, and contact pads 15b and 25b are aligned with one another and are mounted on one another. Moreover, blocks 12 and 22, as well as blocks 13 and 23, and blocks 14 and 24 are aligned with one another and are mounted on one another, respectively.

In the context of the present disclosure and in the claims, the term "mounted on", and grammatical variations thereof refers to contact pads of IC dies 11 and 21 placed in contact with one another. For example, after stacking IC dies 11 and 21 FTF, contact pads 17b and 27b are placed in contact with one another.

In the present example, IC die 11 has through-silicon vias (TSVs) 31, and interconnects 32, such as bumps or balls of a ball-grid array (BGA), connected to TSVs 31 for exchanging electrical signals between IC die 11 and a device other than IC die 21. Note that IC dies 11 and 21 are packaged together in package 33, and interconnects 32 are configured to function as input/output (I/O) ports of package 33.

In some embodiments, IC die 21 comprises a first set of layers (e.g., active area, gate, source/drain, contact, metal 1, via, metal 2, and more), and IC die 11 comprises a second set of layers having the same name of the first set of layers. The functionality of the layers is similar between the two sets, but the layout of the respective layers is different between the two sets.

For example, a given layer (e.g., metal 1 layer) of IC die 21 comprises a first set of circuit components (e.g., pattern of metal 1 lines) arranged in a first geometrical model, also referred to herein as a first layout. Similarly, the metal 1 layer of IC die 11 comprises a second set of circuit components (e.g., pattern of metal 1 lines) arranged in a second geometrical model also referred to herein as a second layout. In some embodiments, the second layout of the metal 1 layer of IC die 21 is a mirror image of the first layout of the metal 1 layer of IC die 11. In other words, the functionality, and the structure of layers in a sectional view are similar between IC dies 11 and 21, but the layout in XY plain of one or more layers of IC die 11 is a mirror image of the corresponding one or more layers of IC die 21.

Figure 4:
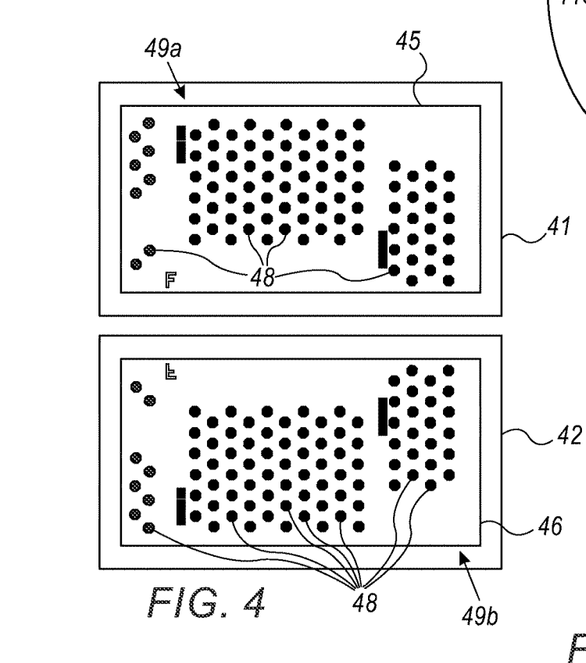
FIG. 4 is a schematic, top view of first and second reticles of the first and second IC dies, respectively, in accordance with an embodiment of the present invention.

FIG. 4 is a schematic, top view of first and second reticles 41 and 42 of IC dies 21 and 11, respectively, in accordance with an embodiment of the present invention.

In some embodiments, IC dies 21 and 11 are produced using very large-scale integration (VLSI) processes, such as deposition of layers, photolithography and etching, photoresist removal, planarization and other processes. The photolithography process defines the first and second geometrical patterns in various layers of IC dies 21 and 11. The etching process transfers the first and second geometrical patterns to the respective layers of IC dies 21 and 11.

In the photolithography process, a beam (e.g., having a wavelength of 193 nm or any other suitable wavelength) is directed to a reticle, such as reticles 41 and 42, typically positioned between the beam source and semiconductor wafer(s) processed for producing IC dies 21 and 11, respectively.

In some embodiments, reticles 41 and 42 comprise two or more masks. In the present example each reticle comprises a single mask. Reticle 41 comprises a mask 45 and reticle 42 comprises a mask 46. Each of masks 45 and 46 comprises a set of elements 48 that are arranged in masking geometrical patterns 49a and 49b, respectively. In the present example, elements 48 are arranged, in mask 45, in masking geometrical pattern 49a, and elements 48 are arranged, in mask 46, in masking geometrical pattern 49b. Note that elements 48 are configured to attenuate the beam impinging thereon, so as to define the geometrical pattern in the respective layer of the respective IC die.

Moreover, in the example of FIG. 4, the position of all elements 48 corresponds to the position of the respective contact pads of IC dies 21 and 11. Note that in photolithography processes the wavelength of the beam may differ between different layers of the respective IC die.

For example, when using a beam having a wavelength of 193 nm, the beam is: (i) substantially attenuated (e.g., fully blocked) while impinging on elements 48, and (ii) passes through the mask (e.g., mask 46) toward the wafer, so as to define the desired geometrical pattern. In an extreme ultraviolet (EUV) lithography process, the beam has a wavelength of 13.5 nm, and a portion of the beam that is not impinging on elements 48, is reflected toward the wafer for defining the desired geometrical pattern.

In other words, masks 45 and 46 of the outer layer the IC dies have elements 48 for producing the contact pad of IC dies 21 and 11, respectively. In example of FIG. 4: (i) mask 45 has masking geometrical pattern 49a of beam-attenuating elements 48, and (ii) mask 46 has masking geometrical pattern 49b, which is a mirror image of masking geometrical pattern 49a. Note that the area of reticles 41 and 42 is similar, and the area of masks 45 and 46 is similar, because IC dies 21 and 11 are of the same product.

In other embodiments, the IC dies intended to be stacked on one another may be of different products, and the area of the respective masks may be different.

In the example of FIG. 4, the area of masks 45 and 46 is larger than half of the area of respective reticles 41 and 42. In such embodiments, mask 45 and 46 must be on separate reticles 41 and 42, respectively. Note that in this configuration, each layer of IC dies 21 and 11 requires a respective set of masks, and separate (e.g., first and second) sets of photolithography process steps are required for patterning the respective set of layers of IC dies 21 and 11. Note that the photolithography processes may be similar in producing both IC dies 21 and 11, but due to the different masks, the pattern definition of each layer must be carried out separately for each of IC dies 21 and 11.

Figure 5:
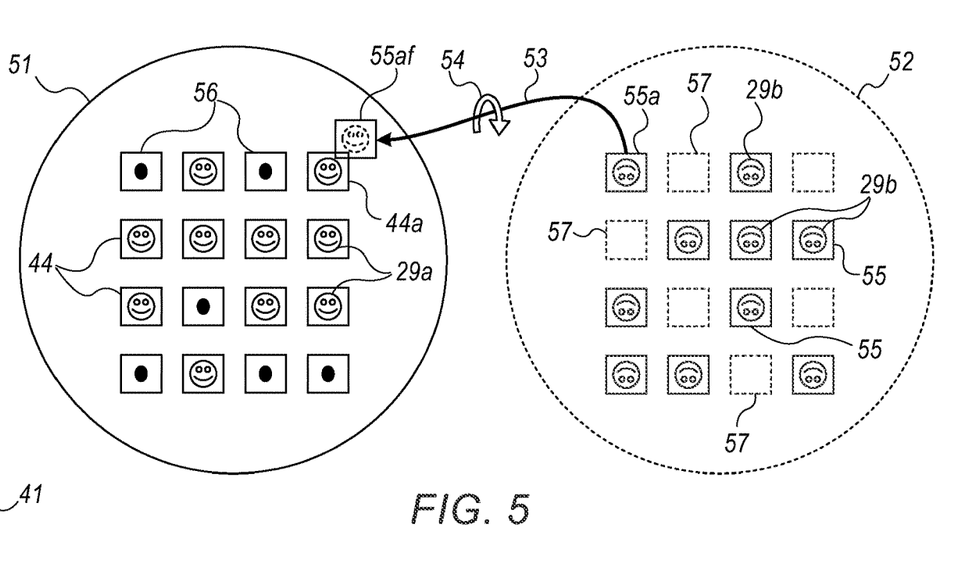
FIG. 5 is a schematic, top view of first and second wafers patterned using the first and second reticles of FIG. 4, in accordance with an embodiment of the present invention.

FIG. 5 is a schematic, top view of wafers 51 and 52 patterned using reticles 41 and 42, respectively, in accordance with an embodiment of the present invention.

In some embodiments, wafers 51 and 52 have completed the VLSI processes described in FIG. 4 above, and are now being assembled, including the FTF stacking of IC dies 21 and 11 on one another.

In some embodiments, wafer 51 comprises known good sites (KGSs) 44 that have successfully passed a testing procedure, and scrapped sites 56 that have failed to pass the testing procedure successfully. After dicing wafer 51 and separating between adjacent sites (e.g., KGSs 44 and/or scrapped sites 56), (i) scrapped sites 56 will be trashed, and (ii) KGSs 44 are intended to constitute IC dies 21.

In the context of the present disclosure and in the claims, the term wafer refers to a substrate, which is typically made from a single crystal of semiconductor material(s), such as but not limited to a silicon wafer. In other embodiments, instead of using a wafer, the dies (e.g., dies 11, 21, 44 and other dies of the present disclosure) may be formed on any other suitable type of substrate.

In some embodiments, wafer 52 has already been tested, and subsequently, undergone the dicing and separation processes described above.

In some embodiments, wafer 52 comprises known good dies (KGDs) 55 that have successfully passed the testing procedure and have been separated, and scrapped dies 57 that have failed to pass the testing procedure successfully.

After the dicing of wafer 52 and the separation between the dies (e.g., KGDs 55 and/or scrapped dies 57), (i) scrapped dies 57 have been trashed, and therefore, appear in dashed lines. and (ii) KGDs 55 are intended to constitute IC dies 11. In the context of the present disclosure and in the claims, (i) the term "known good sites (KGSs)" refers to sites in a wafer that has not been diced yet, but have passed the testing procedure successfully and are intended to constitute IC dies, and (ii) the term "known good dies (KGDs)" refers to sites in a wafer that has already been diced, passed the testing procedure successfully, and are intended to constitute IC dies.

In some embodiments, in the assembly process each KGD 55 is picked up by a pick and place robotic arm (not shown) and is: (i) flipped, and (ii) moved toward a respective KGS 44 on wafer 51. In the example of FIG. 5, using the pick and place robotic arm, a KGD 55a is moved in a direction 53 and flipped in a direction 54, for being placed over the outer surface of a KGS 44a of wafer 51. Note that after being flipped, KGD 55a is denoted KGD 55af, where the "f" refers to the flipped position of KGD 55a. Moreover, in the flipped position, pattern 29b is pacing wafer 51, and therefore, appears in dashed lines.

As described in FIG. 1 above, geometrical pattern 29b of the contact pads of KGDs 55, which are intended to be IC dies 11, is a mirror image of geometrical pattern 29a of the contact pads of KGSs 44, which are intended to be IC dies 21.

In the example of FIG. 5, geometrical pattern 29a is illustrated as a smiley face, and geometrical pattern 29b is illustrated as a mirror image of the smiley face. With reference to FIG. 1 above, geometrical pattern 29b is illustrated in FIG. 5 as a smiley face flipped in direction 19 about axis 20 (both shown in FIG. 1 above).

In some embodiments, after being flipped about axis 20, geometrical pattern 29b appears as a smiley face, similar to geometrical pattern 29b. In such embodiments, when the outer surface of KDG 55af is facing the outer surface of KGS 44a, the blocks (e.g., blocks 13 and 23) and contact pads (e.g., contact pads 17b and 27b) of KGD 55af and KGS 44a are aligned with one another and are mounted on one another, as shown in FIG. 3 above.

Figure 6:
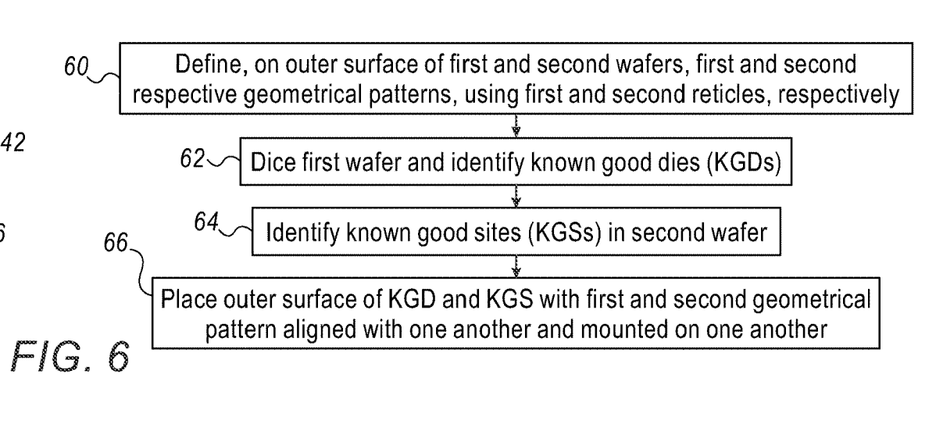
FIG. 6 is a flow chart that schematically illustrates a method for FTF stacking the first and second IC dies patterned using the first and second reticles of FIG. 4, in accordance with an embodiment of the present invention.

FIG. 6 is a flow chart that schematically illustrates a method for FTF stacking geometrical patterns 29a and 29b of IC dies 21 and 11, respectively, in accordance with an embodiment of the present invention.

The method begins at a pattern definition step 60, with using photolithography processes and reticles 41 and 42 for defining on the outer surface of wafers 52 and 51, geometrical patterns 29a and 29b, respectively, as described in detail in FIGS. 4 and 5 above.

At a dicing step 62, wafer 52 is diced and KGDs 55 that passed the testing procedure successfully, are identified as described in detail in FIG. 5 above.

At a KGS identification step 64, KGSs 44 that passed the testing procedure successfully, are identified as described in detail in FIG. 5 above.

At a mounting step 66 that concludes the method, the pick and place robotic arm is used for placing the flipped geometrical pattern 29b of KGD 55af, on geometrical pattern 29a of KGS 44a, as described in detail in FIG. 5 above. Note that when flipped and mounted properly, at least contact pads 17b and 27b, contact pads 15c and 25c, and contact pads 15b and 25b, are aligned with one another and are placed in contact with one another, as described in detail in FIG. 3 above.

Figure 7:
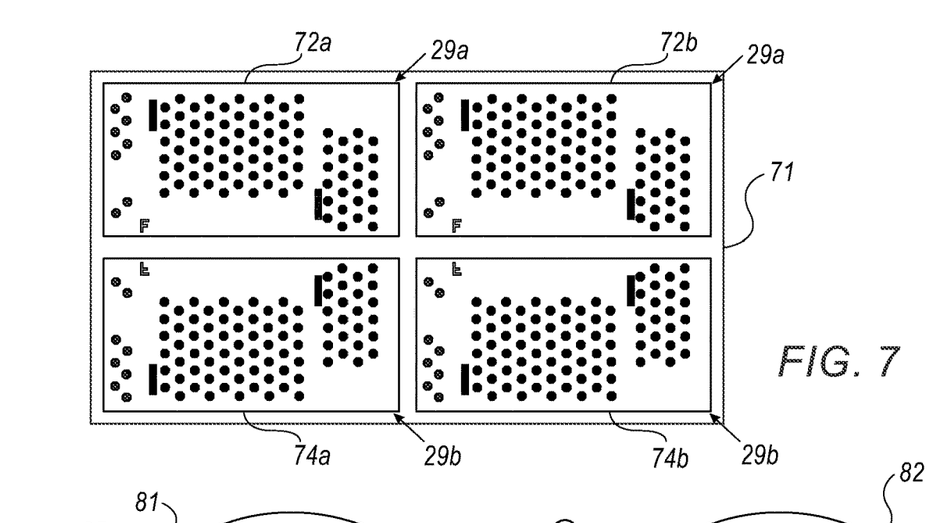
FIG. 7 is a schematic, top view of a reticle having multiple masks for producing the first and second IC dies, in accordance with another embodiment of the present invention.

FIG. 7 is a schematic, top view of a reticle 71 for producing IC dies 21 and 11, in accordance with another embodiment of the present invention.

In some embodiments, reticle 71 comprises similar masks 72a and 72b, each of which has contact pads arranged in geometrical pattern 29a for producing IC die 21. Reticle 71 further comprises similar masks 74b and 74a, each of which has contact pads arranged in a geometrical pattern 29b for producing IC die 11. In other words, at least one mask for producing IC die 21 and at least one mask for producing IC die 11 are disposed on the same reticle.

Note that a typical size of a reticle used in photolithography processes is about 26 mm by 33 mm, so the area of the reticle is about 858 mm². In the example of FIG. 4, the size of each mask (e.g., masks 45 and 46) is larger than 13 mm by 17 mm, and therefore, only one mask 45 fits in reticle 41.

In the example of FIG. 7, the size of each mask (e.g., masks 72a and 74a) is smaller than 10 mm by 14 mm, and therefore, reticle 71 may comprise four masks 72a, 72b, 74a and 74b.

In some embodiments, one photolithography process may be used for defining geometrical patterns 29a and 29b on the same wafer, because the masks for producing both IC dies 21 and 11 are exposed to the beam of the photolithography system during the same photolithography process step. The process flow for producing IC dies 21 and 11, and for stacking IC dies 21 and 11 FTF on one another, is described in more detail in FIGS. 8 and 9 below.

Figure 8:
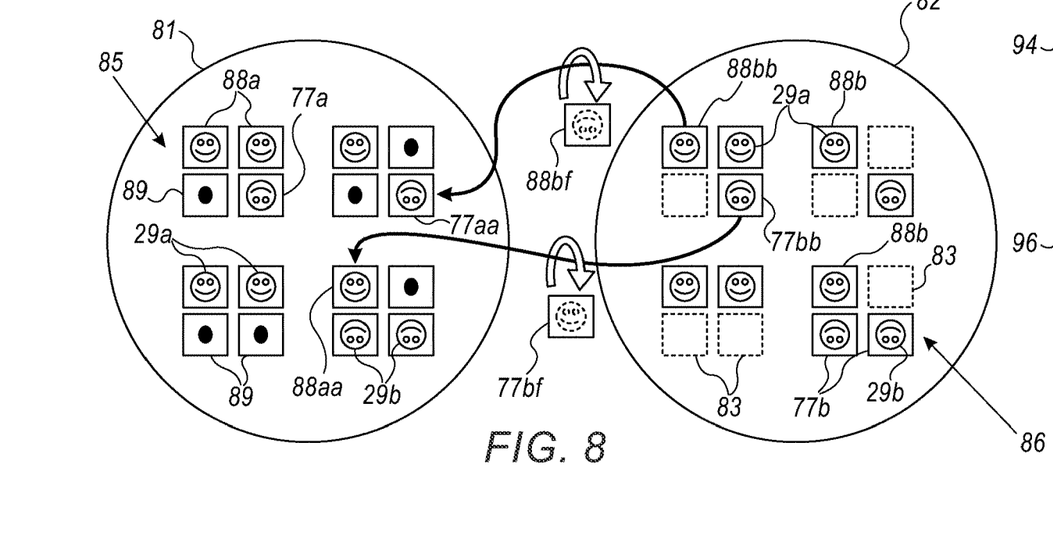
FIG. 8 is a schematic, top view of wafers patterned using the reticle of FIG. 7, in accordance with another embodiment of the present invention.

FIG. 8 is a schematic, top view of wafers 81 and 82 patterned using reticle 71 of FIG. 7, in accordance with another embodiment of the present invention.

In some embodiments, wafer 81 comprises multiple fields 85, each of which corresponding to the geometrical patterns produced using reticle 71 in the photolithography process described in FIG. 7 above. In the present example, wafer 81 has been tested, but has not yet been diced. In such embodiments, each field 85 may comprise: (i) one or more scrapped site(s) 89, and/or (ii) one or more KGSs 88a having geometrical pattern 29a produced using masks 72a and/or 72b of reticle 71, and/or (iii) one or more KGSs 77a having geometrical pattern 29b produced using masks 74a and/or 74b of reticle 71.

In some embodiments, wafer 82 comprises multiple fields 86, each of which corresponding to the geometrical patterns produced using reticle 71 in the photolithography process described in FIG. 7 above. Note that reticle 71 comprises four sections, i.e., masks 72a, 72b, 74a and 74b, and each field 85 and 86 comprises four sections corresponding to the sections of reticle 71. The upper two sections of fields 85 and 86 have geometrical pattern 29a produced using masks 72a and/or 72b. Similarly, the lower two sections of fields 85 and 86 have geometrical pattern 29b produced using masks 74a and/or 74b.

In the present example, wafer 82 has been tested and diced. In such embodiments, each field 86 may comprise: (i) one or more scrapped die(s) 83, and/or (ii) one or more KGDs 88b having geometrical pattern 29a produced using masks 72a and/or 72b of reticle 71, and/or (iii) one or more KGDs 77b having geometrical pattern 29b produced using masks 74a and/or 74b of reticle 71. As described in FIG. 5 above, scrapped dies 83 appear in dashed lines for failing to pass the testing procedure successfully. Similarly, scrapped sites 89 have a marking, such as ink or any other suitable marking, indicative of failing to pass the testing procedure successfully.

Reference is now made to wafer 82. In some embodiments, after dicing and separating each KGD (i.e., KGDs 77b and 88b), the pick and place robotic arm picks a given KGD, moves and flips the given KGD, and mounts the given KGD on a suitable selected KGS. Note that the given KGD has the first geometrical pattern of the contact pads, and the selected KGS has the second geometrical pattern of the contact pads. In such embodiments, the contact pads of the given KGD are aligned with the respective contact pads of the selected KGS, as shown in FIG. 3 above.

In the example of FIG. 8, a first given KGD is referred to herein as a KGD 88*bb*, which is being picked by the robotic arm, and subsequently, being moved and flipped. Note that after being flipped, KGD 88*bb* is referred to herein as a KGD 88*bf*, and the robotic arm mounts KGD 88*bf* over a first selected KGS, referred to herein as a KGS 77*aa*. Similarly, a second given KGD is referred to herein as a KGD 77*bb*, which is being picked by the robotic arm, and subsequently, being moved and flipped. Note that after being flipped, KGD 77*bb* is referred to herein as a KGD 77*bf*, and the robotic arm mounts KGD 77*bf* over a second selected KGS, referred to herein as a KGS 88*aa*.

Note that because wafers 82 has both KGDs 77*b* and 88*b*, and wafer 82 has both KGSs 77*a* and 88*a*. Therefore, after being picked, moved and flipped, it is important to mount: (i) a KGD 88*b* on a KGS 77*a*, and (ii) a KGD 77*b* on a KGS 88*a*. By implementing this limitation, the contact pads of the KGD and the respective KGS will be aligned with one another after the FTF stacking, as shown for example in FIG. 3 above. In case a KGD 88*b* is mounted FTF over a KGS 88*a*, the contact pads of the KGD and the respective KGS will be not aligned with one another, due to the geometrical pattern that is non-symmetrical under reflection about axis 20 shown in FIG. 1 above.

Figure 9:
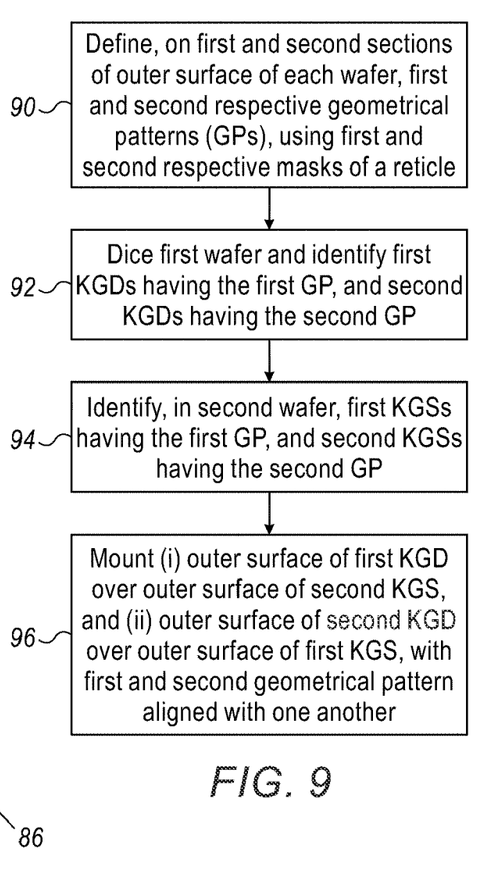
FIG. 9 is a flow chart that schematically illustrates a method for FTF stacking the first and second IC dies patterned using the reticle of FIG. 7, in accordance with another embodiment of the present invention.

FIG. 9 is a flow chart that schematically illustrates a method for FTF stacking IC dies 21 and 11 produced using reticle 71 of FIG. 7 above, in accordance with another embodiment of the present invention.

The method begins at a photolithography step 90, with defining geometrical patterns 29*a* and 29*b* in first and second respective sections of each field produced on the outer surface of each wafer. In the example of FIG. 8, after passing the testing procedure successfully: (i) the first and second sections of field 86 in wafer 82 are referred to as KGDs 88*b* and 77*b*, and (ii) the first and second sections of field 85 in wafer 81 are referred to as KGSs 88*a* and 77*a*. In some embodiments, geometrical patterns 29*a* and 29*b* are typically formed in both fields 85 and 86, using masks 72*a*, 72*b*, 74*a* and 74*b* of reticle 71, as described in detail in FIGS. 7 and 8 above.

At a dicing step 92, after performing the testing procedure and identifying KGDs 77*b* (having geometrical pattern 29*b*) and 88*b* (having geometrical pattern 29*a*), wafer 82 is diced and the KGDs are separated. In some embodiments, KGDs 77*b* and KGDs 88*b* are sorted, so as to prevent errors in the mounting process, as described in detail in FIG. 8 above.

At a KGS identification step 94, based on the testing procedure, identifying KGSs 77*a* having geometrical pattern 29*b*, and KGSs 88*a* having geometrical pattern 29*a*. In some embodiments, the positions of each KGS 77*a* and each KGS 88*a* on wafer 82 are stored in a processor of the pick and place system.

At a mounting step 96 that concludes the method, the pick and place system mounts: (i) the outer surface of each KGD 88*b* over the outer surface of a respective KGS 77*a*, so that geometrical pattern 29*a* is mounted on and aligned with geometrical pattern 29*b*, and (ii) the outer surface of each KGD 77*b* over the outer surface of a respective KGS 88*a*, so that geometrical pattern 29*b* is mounted on and aligned with geometrical pattern 29*a*.

In some embodiments, after mounting the KGDs over the KGSs in a FTF configuration, and coupling therebetween, wafer 81 is diced and each stack is separated. Note that after the dicing and separation: (i) each former KGD 88*b* and each former KGS 88*a* are referred to as IC die 11, and (ii) each former KGD 77*b* and each former KGS 77*a* are referred to as IC die 21. In some embodiments, each stack of IC dies 21 and 11 (also referred to herein as first and second chips) that are mounted on one another in the FTF configuration, is mounted on package 33, as shown in FIG. 3 above, for producing any suitable type of electronic device.

Although the embodiments described herein mainly address face-to-face stacking of a pair of similar IC dies, the methods and devices described herein can also be used in other applications, such as in FTF stacking of any sort of first and second IC dies that are different from one another, and yet, have on their outer surfaces first and second geometrical patterns, respectively, which are non-symmetrical under reflection about a given axis, and are mirror images of one another at least in one section thereof.

It will thus be appreciated that the embodiments described above are cited by way of example, and that the present invention is not limited to what has been particularly shown and described hereinabove. Rather, the scope of the present invention includes both combinations and sub-combinations of the various features described hereinabove, as well as variations and modifications thereof which would occur to persons skilled in the art upon reading the foregoing description and which are not disclosed in the prior art. Documents incorporated by reference in the present patent application are to be considered an integral part of the application except that to the extent any terms are defined in these incorporated documents in a manner that conflicts with the definitions made explicitly or implicitly in the present specification, only the definitions in the present specification should be considered.

The invention claimed is:

1. A. A set of reticles, the set comprising:
at least a first mask for producing a first integrated circuit (IC) die, the first mask comprising a first set of elements that are arranged in a first geometrical pattern and are configured to attenuate a beam impinging thereon; and
at least a second mask for producing a second IC die, the second mask comprising a second set of the elements that are (i) arranged in a second geometrical pattern that is a mirror image of the first geometrical pattern and (ii) configured to attenuate the beam impinging thereon.

2. The set of reticles according to claim 1, wherein the first and second masks are located in first and second different reticles in the set.

3. The set of reticles according to claim 1, wherein the first and second masks are located in first and second different sections of a same reticle in the set.

4. A method for producing an electronic device, the method comprising:
producing, on a first surface of a first integrated circuit (IC) die, a first set of contact pads arranged in a first geometrical pattern, wherein producing the first IC die comprises using at least a first mask comprising a first set of elements that are arranged in the first geometrical pattern and are configured to attenuate a beam impinging thereon;
producing, on a second surface of a second IC die, a second set of the contact pads that are arranged in a second geometrical pattern, which is a mirror image of the first geometrical pattern, wherein producing the second IC die comprises using at least a second mask comprising a second set of the elements that are (i) arranged in the second geometrical pattern that is a mirror image of the first geometrical pattern and (ii) configured to attenuate the beam impinging thereon;

positioning the second surface of the second IC die opposite the first surface of the first IC die, such that the contact pads of the first and second sets are aligned with one another; and coupling the contact pads of the first and second sets with one another.

5. The method according to claim 4, wherein producing the first set comprises arranging the first geometrical pattern in a non-symmetrical pattern under reflection about a given axis in a plain of the first IC die, and wherein producing the second set comprises arranging the second geometrical pattern in the mirror image of the first geometrical pattern with respect to the given axis.

6. The method according to claim 4, wherein producing the first and second IC dies comprises applying the beam to the first and second masks, respectively, for producing the first and second geometrical patterns on the first and second surfaces.

7. The method according to claim 6, wherein the first and second masks are located in first and second different reticles, and wherein applying the beam comprises applying a first beam to the first reticle using a first lithography process and applying a second beam to the second reticle using a second lithography process, other than the first lithography process.

8. The method according to claim 7, wherein a plurality of the first IC dies are produced on a first substrate, and a plurality of the second IC dies are produced on a second substrate, different from the first substrate, and comprising identifying: (i) in the first substrate, a known good site (KGS), which is qualified for producing the electronic device and is intended to be the first IC die, and (ii) in the second substrate, a known good die (KGD), which is qualified for producing the electronic device and is intended to be the second IC die.

9. The method according to claim 8, wherein coupling the contact pads of the first and second sets comprises separating the KGD from the second substrate for producing the second IC die and coupling between the contact pads of the second set and the contact pads of the first set that are located together with the first IC die on the first substrate.

10. The method according to claim 6, wherein the first and second masks are located in first and second different sections of a same reticle, and wherein applying the beam comprises applying the beam to the same reticle while preforming a same lithography process.

11. The method according to claim 10, wherein a first plurality of the first and second IC dies are produced on a first substrate, and a second plurality of the first and second IC dies are produced on a second substrate, different from the first substrate, and comprising identifying: (i) in the first substrate, a known good site (KGS), which is qualified for producing the electronic device and is intended to be the first IC die, and (ii) in the second substrate, a known good die (KGD), which is qualified for producing the electronic device and is intended to be the second IC die.

* * * * *